(12) United States Patent
Kewley et al.

(10) Patent No.: US 12,342,549 B2
(45) Date of Patent: Jun. 24, 2025

(54) INTEGRATED CIRCUITRY, ARRAY OF CROSS-POINT MEMORY CELLS, METHOD USED IN FORMING INTEGRATED CIRCUITRY

(71) Applicant: Micron Technology, Inc., Boise, ID (US)

(72) Inventors: David A. Kewley, Boise, ID (US); Kevin Baker, Boise, ID (US); Trupti D. Gawai, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 472 days.

(21) Appl. No.: 17/742,154

(22) Filed: May 11, 2022

(65) Prior Publication Data
US 2023/0371282 A1 Nov. 16, 2023

(51) Int. Cl.
*H01L 23/48* (2006.01)
*G11C 13/00* (2006.01)
*H10B 63/00* (2023.01)

(52) U.S. Cl.
CPC ......... *H10B 63/80* (2023.02); *G11C 13/0023* (2013.01); *G11C 2213/77* (2013.01)

(58) Field of Classification Search
CPC ........ H01L 21/76831; H01L 21/76877; H10N 70/231; H10N 70/066
See application file for complete search history.

(56) References Cited

U.S. PATENT DOCUMENTS

| 6,818,515 | B1 * | 11/2004 | Lee | H01L 21/32139 257/E21.651 |
| 9,842,839 | B1 * | 12/2017 | Sills | H01L 29/7827 |
| 10,707,417 | B1 * | 7/2020 | Bruce | H10N 70/066 |
| 2014/0027701 | A1 * | 1/2014 | Lee | H10N 70/8265 257/4 |
| 2018/0047899 | A1 * | 2/2018 | Horii | H10B 63/80 |
| 2024/0074336 | A1 * | 2/2024 | Ok | H10B 63/82 |

* cited by examiner

*Primary Examiner* — Kyoung Lee
*Assistant Examiner* — David J Goodwin
(74) *Attorney, Agent, or Firm* — Wells St. John P.S.

(57) ABSTRACT

Integrated circuitry comprises a horizontally-elongated insulative wall directly above a conductive node. The wall comprises insulative material. A conductive via extends through the wall to the conductive node. A conductive line is directly above the wall and directly above the conductive via. The conductive via directly electrically couples together the conductive line with the conductive node. Insulator material is longitudinally-along laterally-opposing sides of the wall. An interface of the insulative material of the wall and the insulator material are on each of the laterally-opposing sides of the wall. Other embodiments, including method, are disclosed.

17 Claims, 23 Drawing Sheets

INTEGRATED CIRCUITRY, ARRAY OF CROSS-POINT MEMORY CELLS, METHOD USED IN FORMING INTEGRATED CIRCUITRY

TECHNICAL FIELD

Embodiments disclosed herein pertain to integrated circuitry, to arrays of cross-point memory cells, and to methods used in forming integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

The smallest and simplest memory cell will likely be comprised of two electrodes having a programmable material, and possibly a select device (such as a diode or ovonic threshold switch), received between them. Suitable programmable materials have two or more selectable memory states to enable storing of information by an individual memory cell. The reading of the cell determines which of the states the programmable material is in, and the writing of information to the cell places the programmable material in a predetermined state. Some programmable materials retain a memory state in the absence of refresh, and thus may be incorporated into nonvolatile memory cells.

Arrays of memory cells may comprise a plurality of access lines at one elevation and a plurality of sense lines at another elevation, with at least programmable material there-between. Individual memory cells are written to or read from by application of suitable voltage and/or current to the respective crossing access line and sense line.

DETAILED DESCRIPTION OF EXAMPLE EMBODIMENTS

Embodiments of the invention include methods used in forming integrated circuitry and integrated circuitry independent of method of manufacture. Aspects of the invention were motivated in fabricating an array of cross-point memory cells, although the invention and all claims are not so limited. Example embodiments of methods of forming integrated circuitry are initially described with reference to FIGS. 1-24.

Figure 1:
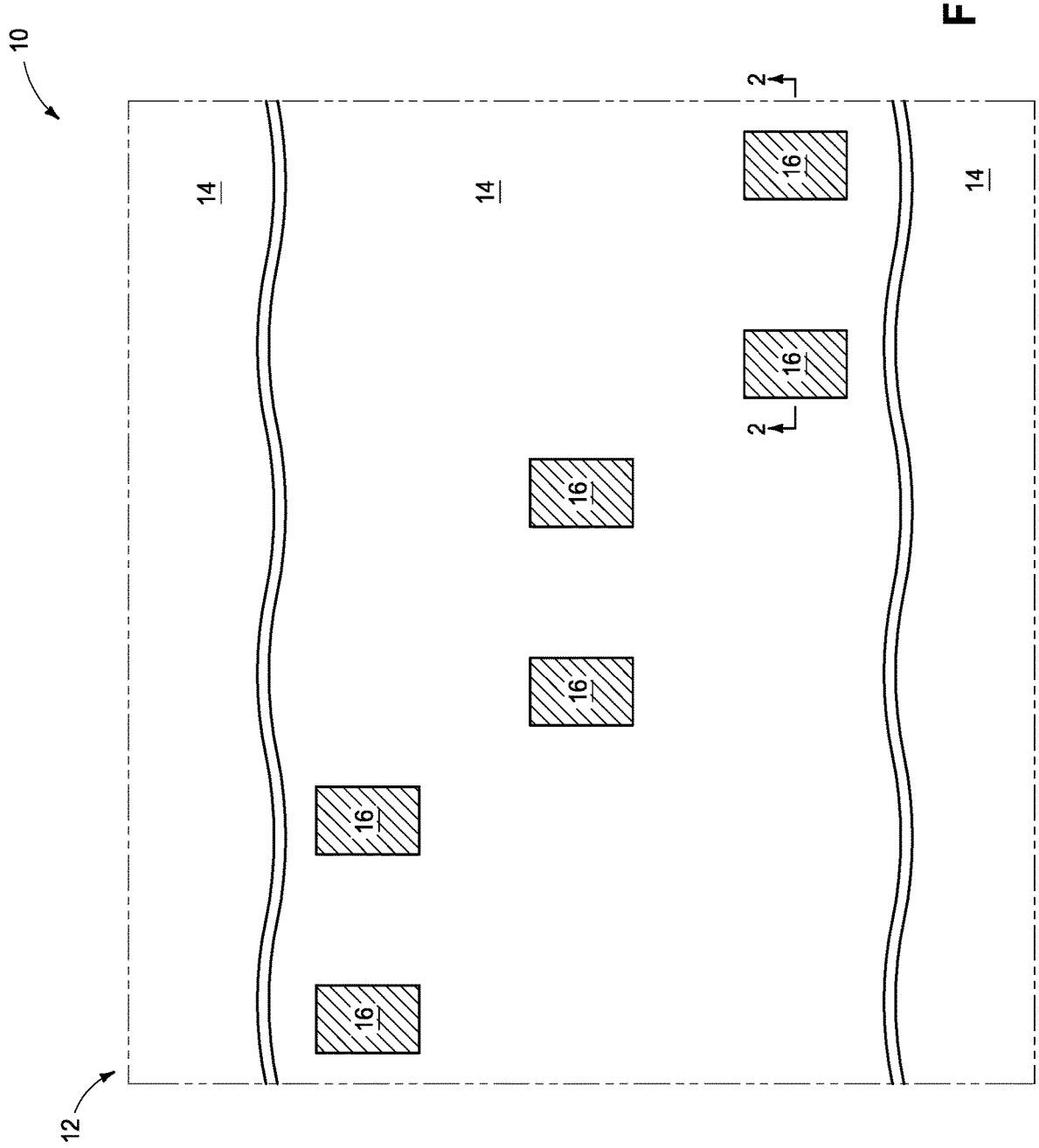
FIG. 1 is a diagrammatic cross-sectional view of a portion of a substrate in process in accordance with an embodiment of the invention and is taken through line 1-1 in FIG. 2.
Figure 2:
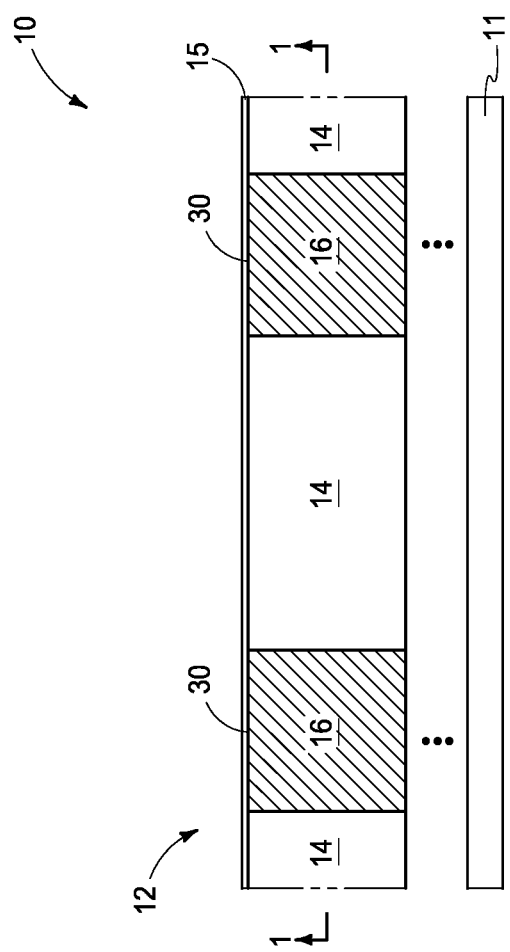
FIG. 2 is an enlarged diagrammatic cross-sectional view taken through line 2-2 in FIG. 1.

Referring to FIGS. 1 and 2, an example substrate construction 10 comprising an array or array area 12 (e.g., a memory array) has been fabricated relative to a base substrate 11. Base substrate 11 may comprise any of conductive/conductor/conducting, semiconductive/semiconductor/semiconducting, and insulative/insulator/insulating (i.e., electrically herein) materials. Various materials are above base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., a cross-point memory array) may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Example insulating material 14 has been formed directly above base substrate 11, for example comprising doped and/or undoped silicon dioxide. Example laterally-spaced conductive nodes 16 ("laterally-spaced" in some vertical cross-section, for example that shown by FIG. 2) are in insulating material 14, for example such being shown as conductive vias 16 extending therethrough to circuitry therebelow (not shown). The discussion largely proceeds with reference to two of laterally-spaced conductive nodes 16 as are shown in FIG. 2 and processing associated therewith. Such nodes need not be horizontally-aligned with one another as shown in FIG. 1 and, if not, need not horizontally overlap. Example conductive nodes 16 individually comprise a top 30. In one embodiment, an example insulating material 15 (e.g., silicon nitride) has been formed above insulating material 14 and conductive nodes 16.

Figure 3:
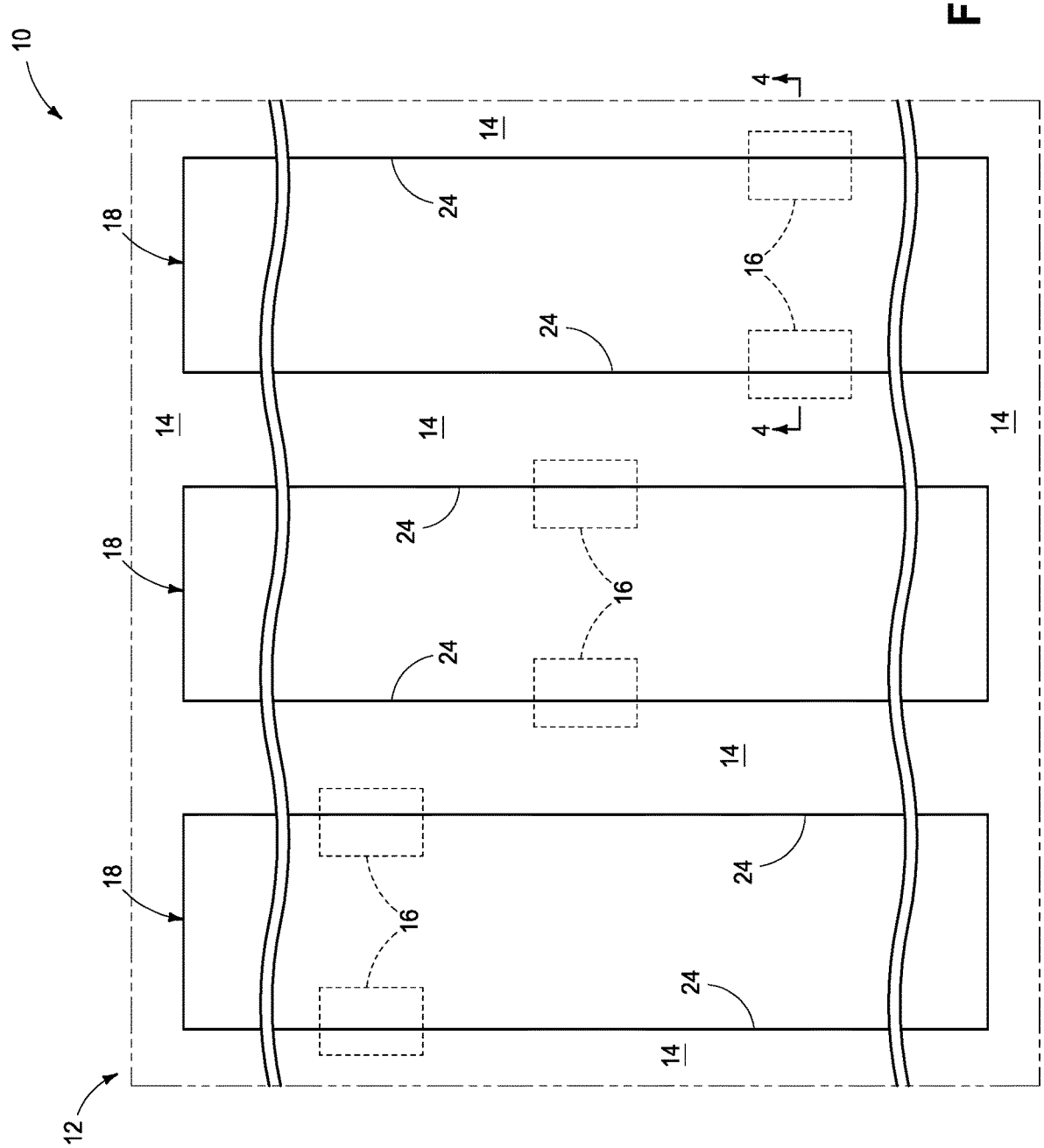
FIGS. 3-24 are diagrammatic sequential sectional, expanded, enlarged, and/or partial views of the construction of FIGS. 1 and 2, or portions thereof, in process in accordance with some embodiments of the invention.
Figure 4:
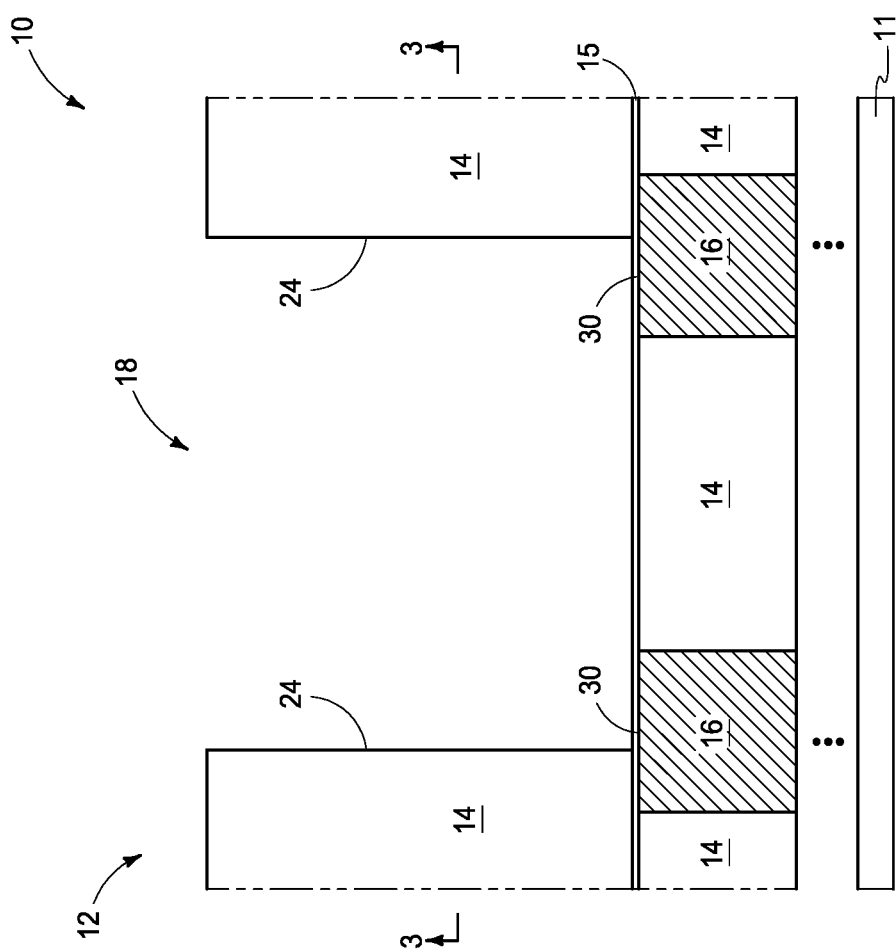

Referring to FIGS. 3 and 4, first insulative material 14 (e.g., doped and/or undoped silicon dioxide, silicon nitride, or aluminum oxide) has been formed directly above two laterally-spaced conductive nodes 16. A horizontally-elongated trench 18 has been formed (e.g., by anisotropic etching) in first insulative material 14, with such being directly above and spanning laterally-between two laterally-spaced conductive nodes 16. Multiple trenches 18 are shown, with the discussion largely proceeding with respect to the trench 18 as seen in the cross-section that is FIG. 4. In the depicted example, trench 18 has been formed to stop atop or within insulating material 15 and may be considered as having laterally-opposing sides 24 (e.g., in the vertical cross-section that is FIG. 4).

Figure 5:
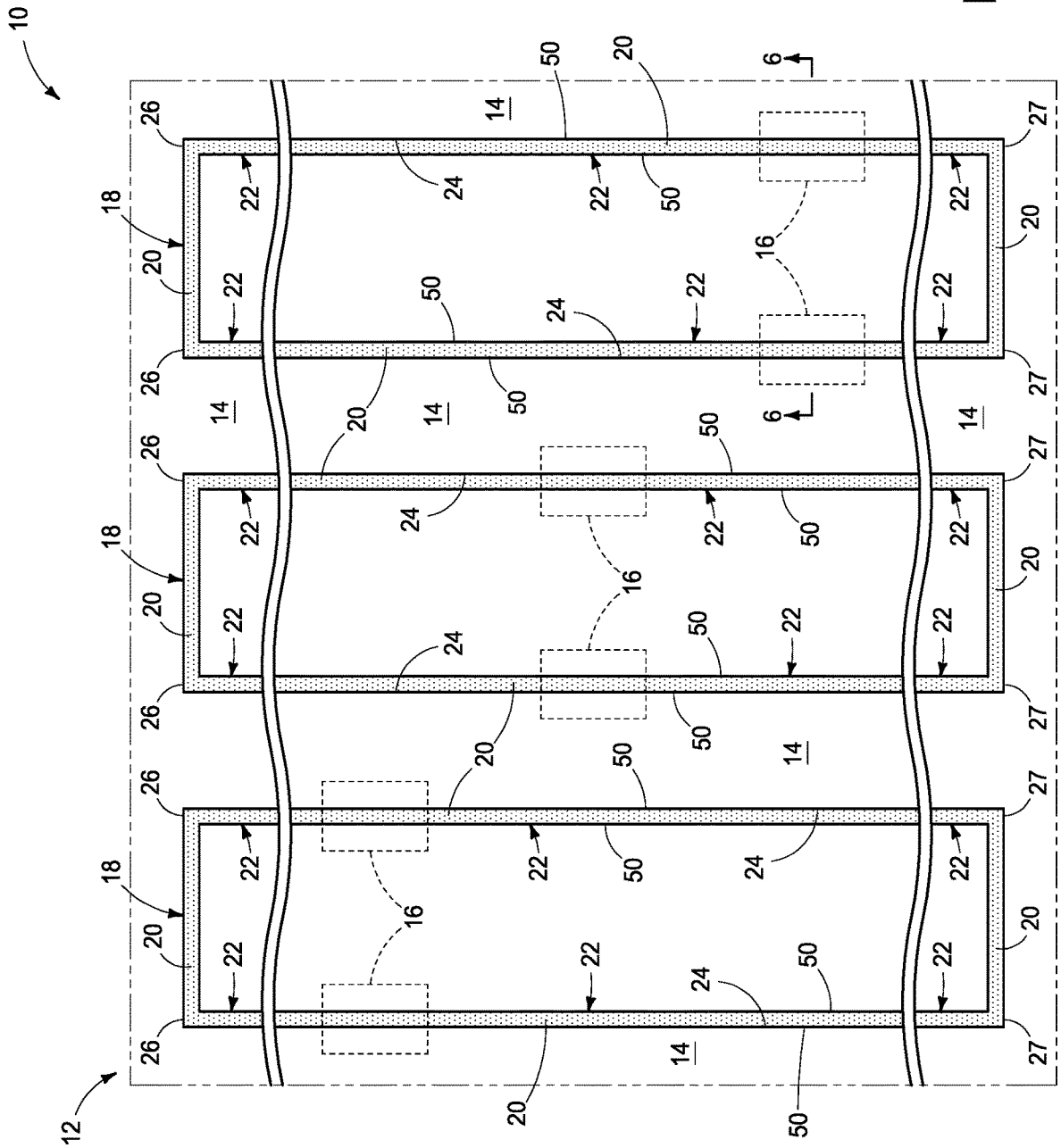
Figure 6:
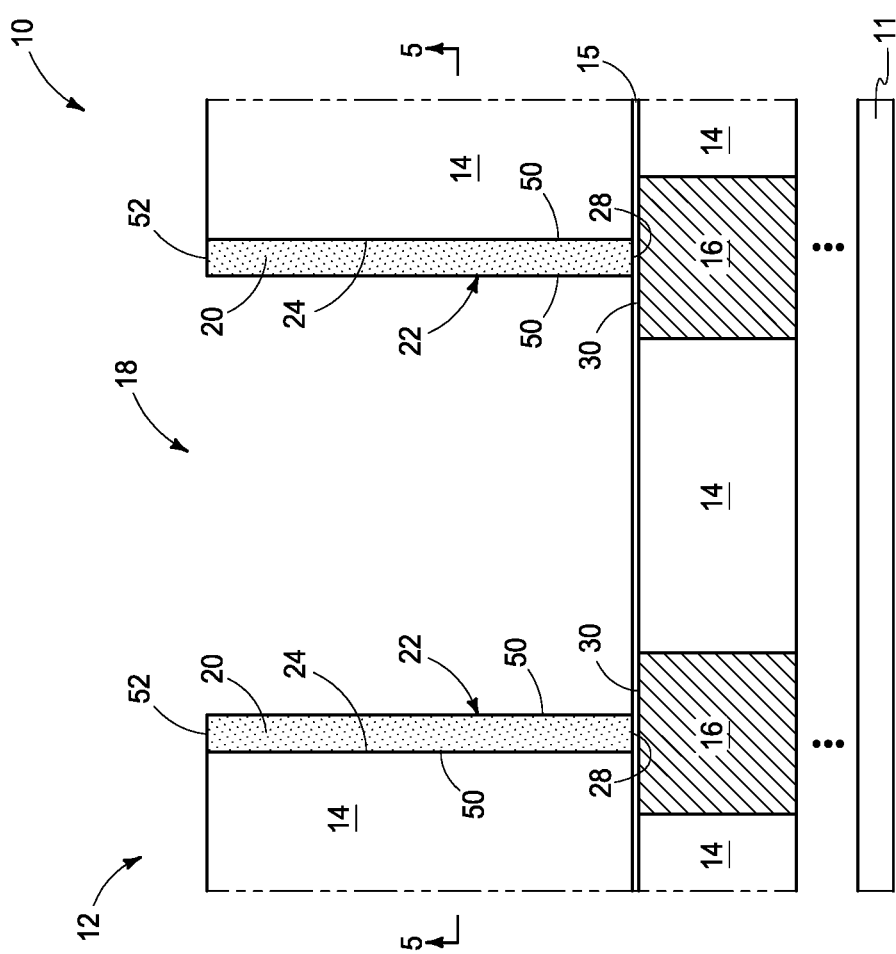

Referring to FIGS. 5 and 6, two horizontally-elongated and laterally-spaced walls 22 have been formed aside laterally-opposing sides 24 of horizontally-elongated trench 18.

Walls 22 comprise insulative material 20 (e.g., doped and/or undoped silicon dioxide, silicon nitride, or aluminum oxide). Individual walls 22 are directly above a respective one of two laterally-spaced conductive nodes 16. An example way of forming walls 22 is by a maskless manner where a thin layer of second insulative material 20 (e.g., of a sublithographic thickness) is deposited atop first insulative material 14, along trench sides 24, and across the bottom of trench 18, followed by maskless anisotropic etching thereof to substantially remove such from being over horizontal surfaces, resulting in the example wall structures 22 as shown.

In one embodiment, walls 22 may be considered as individually having longitudinally-opposing longitudinal ends 26, 27, with walls 22 being connected at their respective such longitudinal ends 26, 27. In one embodiment, first insulative material 14 and second insulative material 20 are of the same composition relative one another, and in another embodiment are of different compositions relative one another. Individual walls 22 may be considered as comprising laterally-opposing sides 50, a bottom 28, and a top 52. In one embodiment and as shown, individual walls 22 have bottom 28 vertically-spaced above top 30 of the respective individual laterally-spaced conductive node 16 directly there-under (e.g., by insulating material 15).

Figure 7:
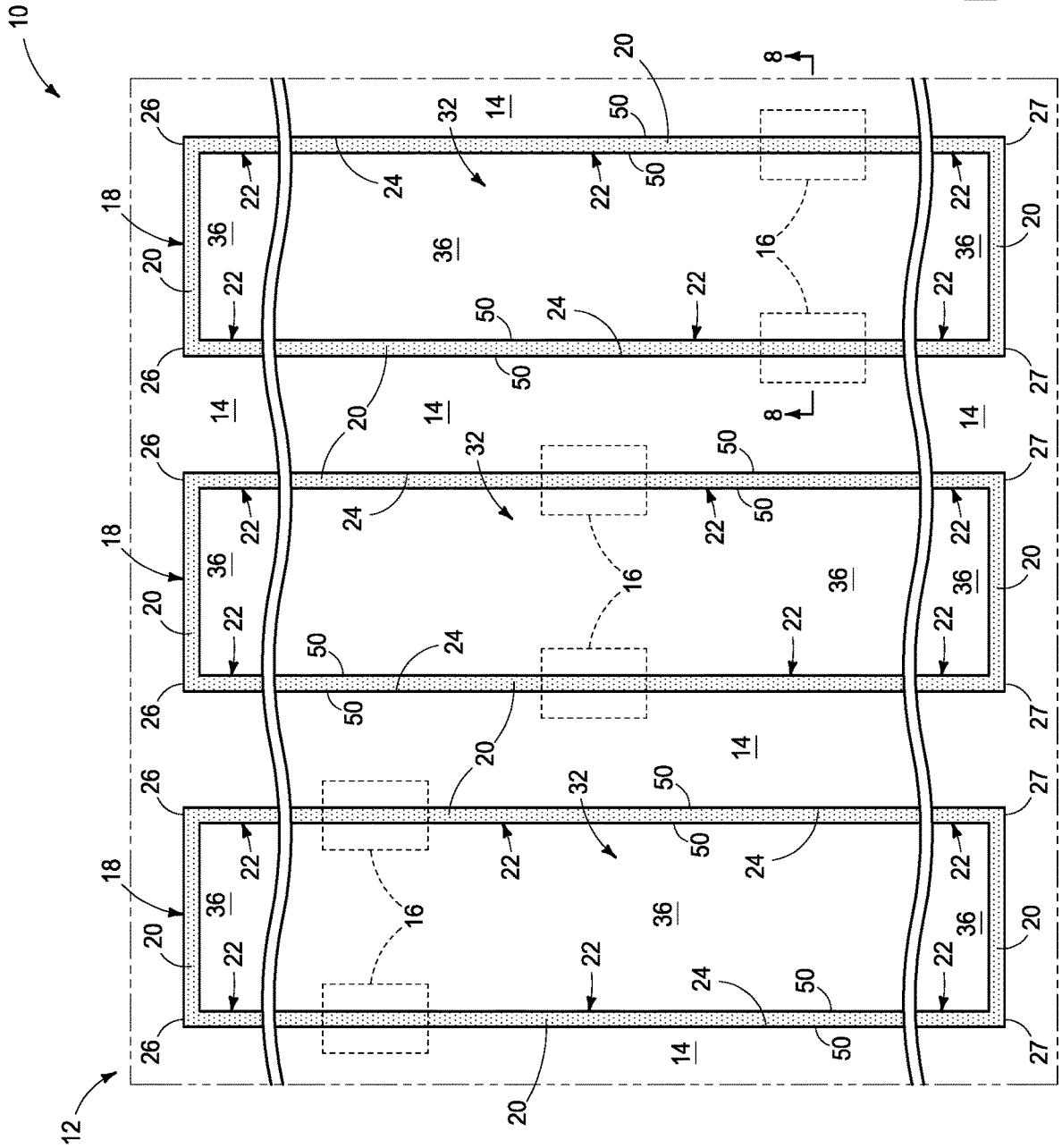
Figure 8:
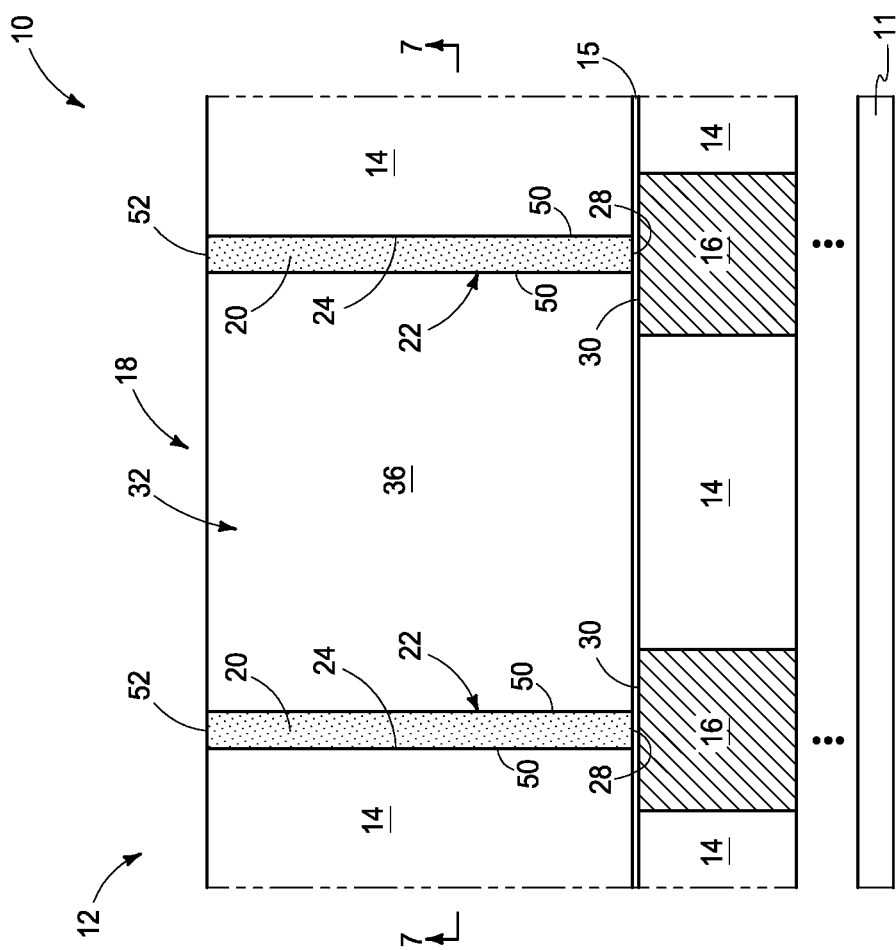

Referring to FIGS. 7 and 8, space 32 that is laterally-between walls 22 has been filled with insulating material 36 (e.g., doped and/or undoped silicon dioxide, silicon nitride, or aluminum oxide), for example by depositing insulating material 36 to overfill space 32 and planarizing such back at least to top surfaces of first insulative material 14 and second insulative material 20. Insulating material 36 and first insulative material 14 may be of the same composition or of different compositions relative one another. Ideally, second insulative material 20 is of different composition from each of first insulative material 14 and insulating material 36 such that a maskless selective etching thereof may occur with respect to materials 14 and 36 (as described below) to avoid a separate masking step.

Figure 9:
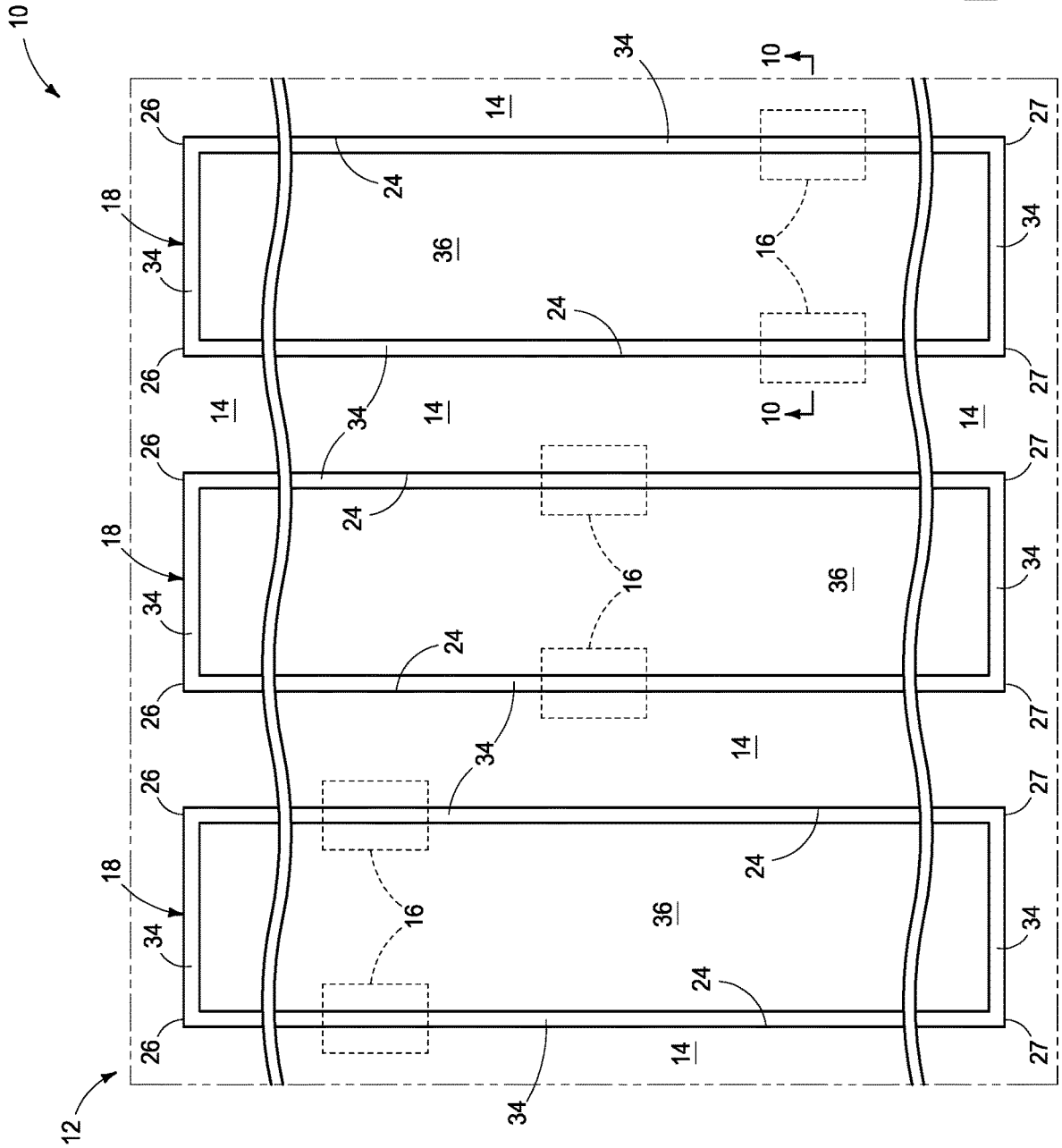
Figure 10:
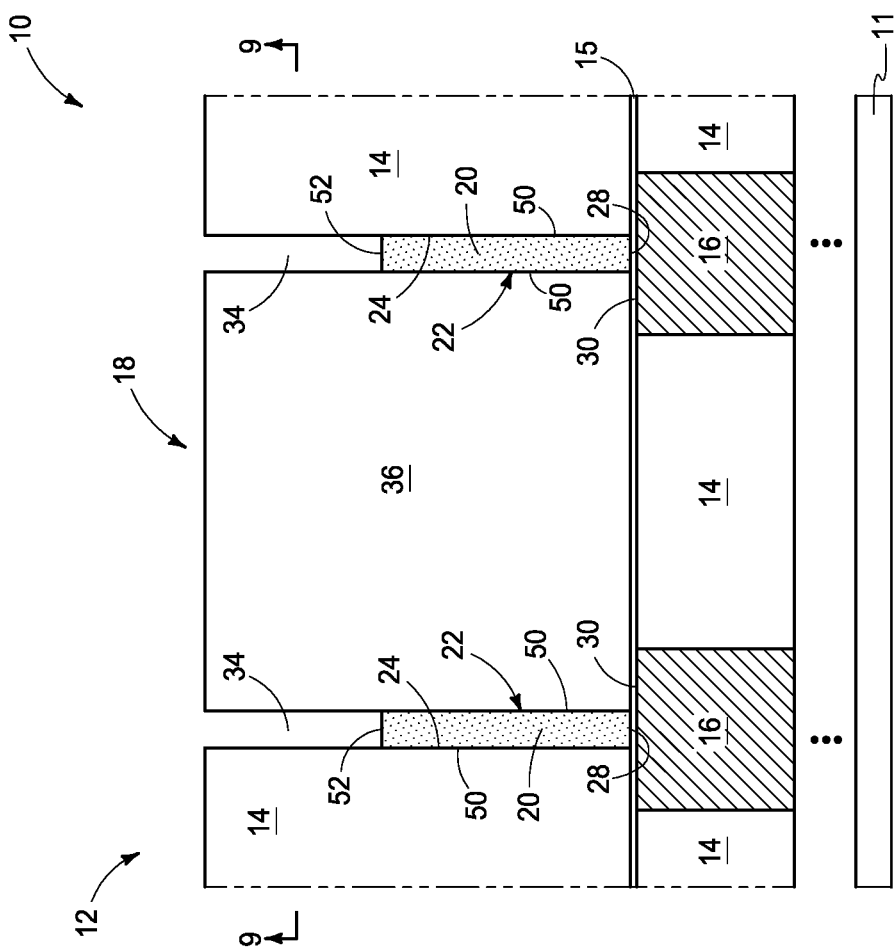

Referring to FIGS. 9 and 10, walls 22 have been vertically recessed relative to uppermost surfaces of first insulative material 14 and insulating material 36 (e.g., by etching material 20 selectively relative to materials 14 and 36), for example thereby forming a horizontally-elongated trough 34 therein that is directly above individual walls 22.

Figure 11:
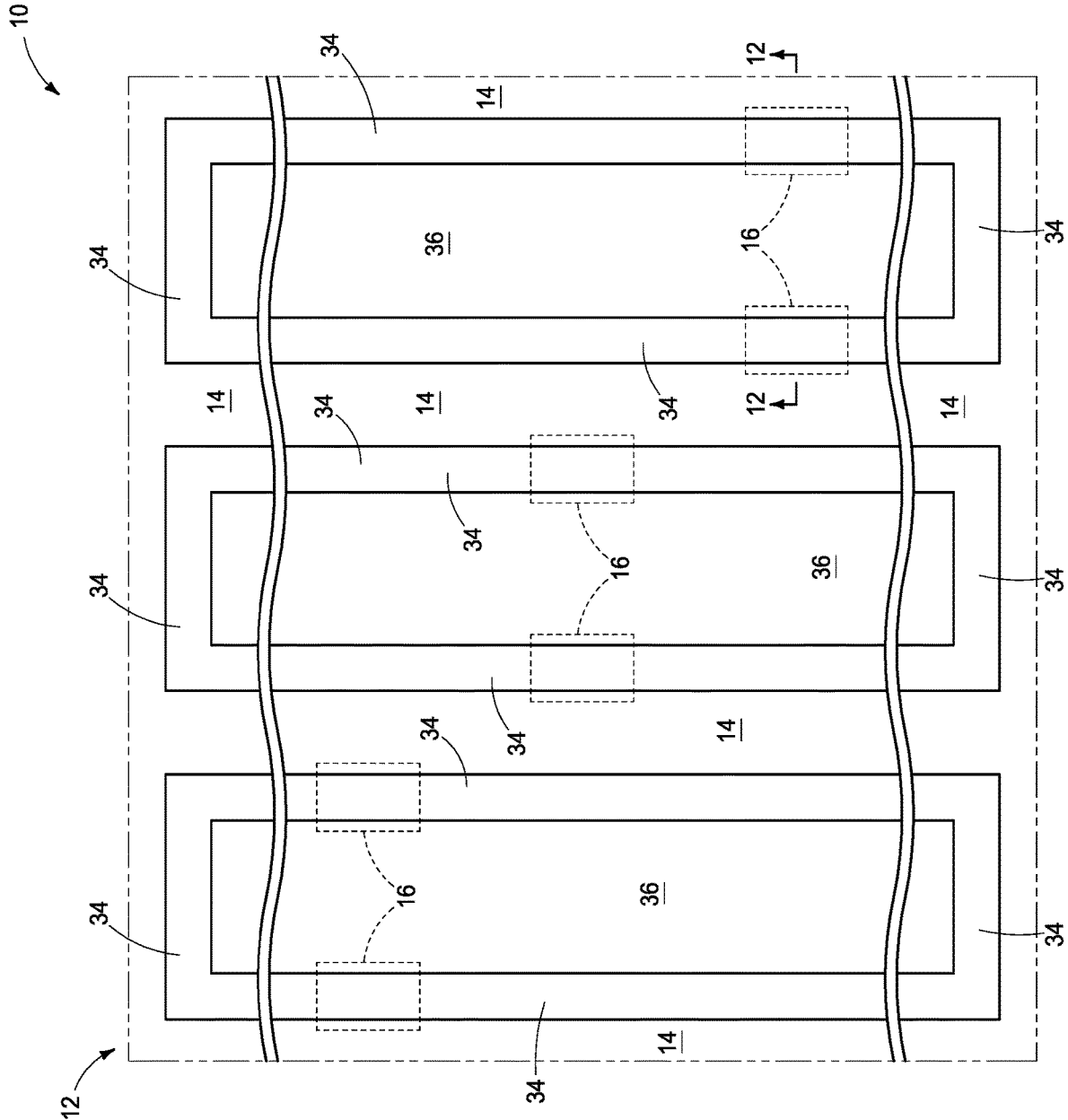
Figure 12:
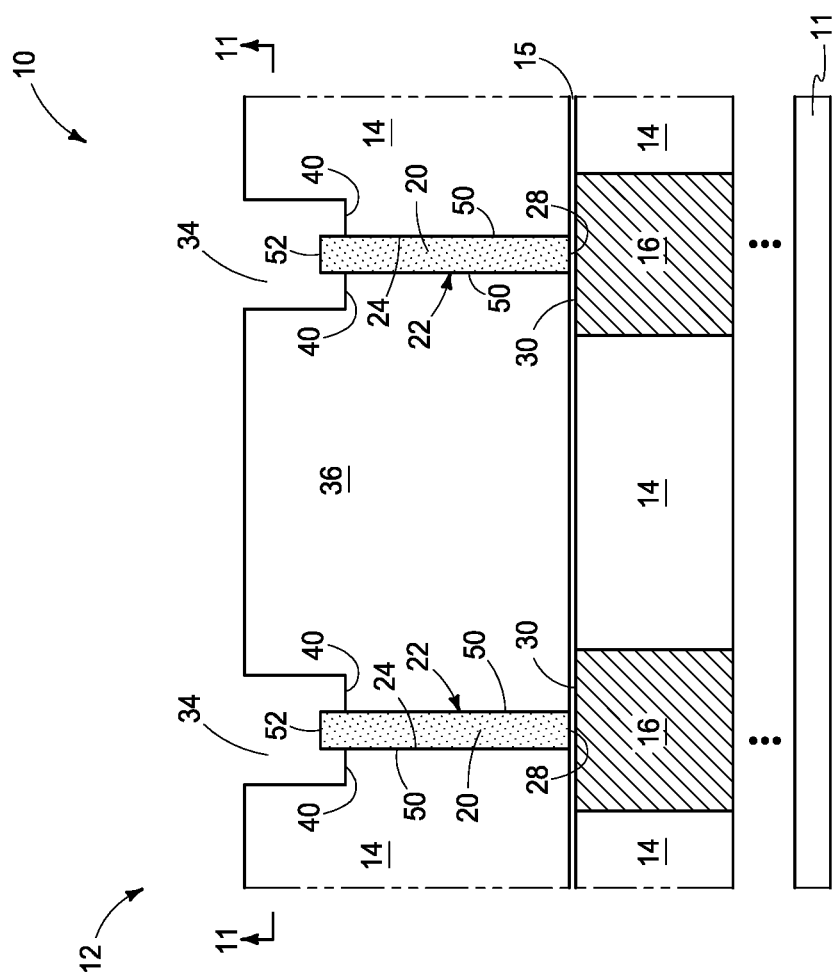

Referring to FIGS. 11 and 12, and in one embodiment, first insulative material 14 and insulating material 36 have been etched (e.g., wet isotropic etching) to laterally-widen trough 34 to be laterally wider than individual walls 22. In one such embodiment and as shown, such etching forms a bottom 40 of horizontally-elongated trough 34 to be lower than tops 52 of individual walls 22 (e.g., on both of laterally-opposing sides 50 of individual walls 22).

Figure 13:
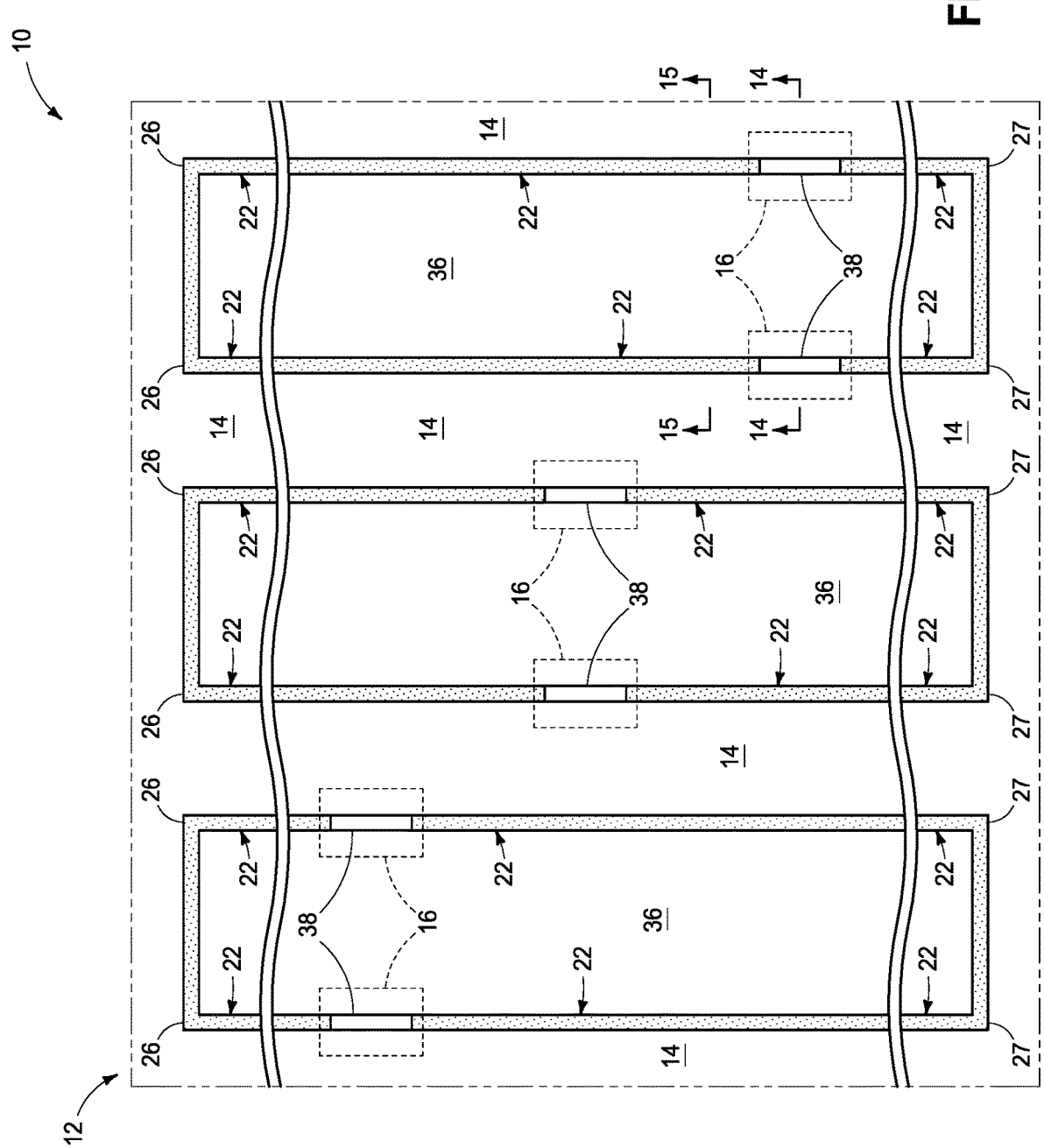
Figure 14:
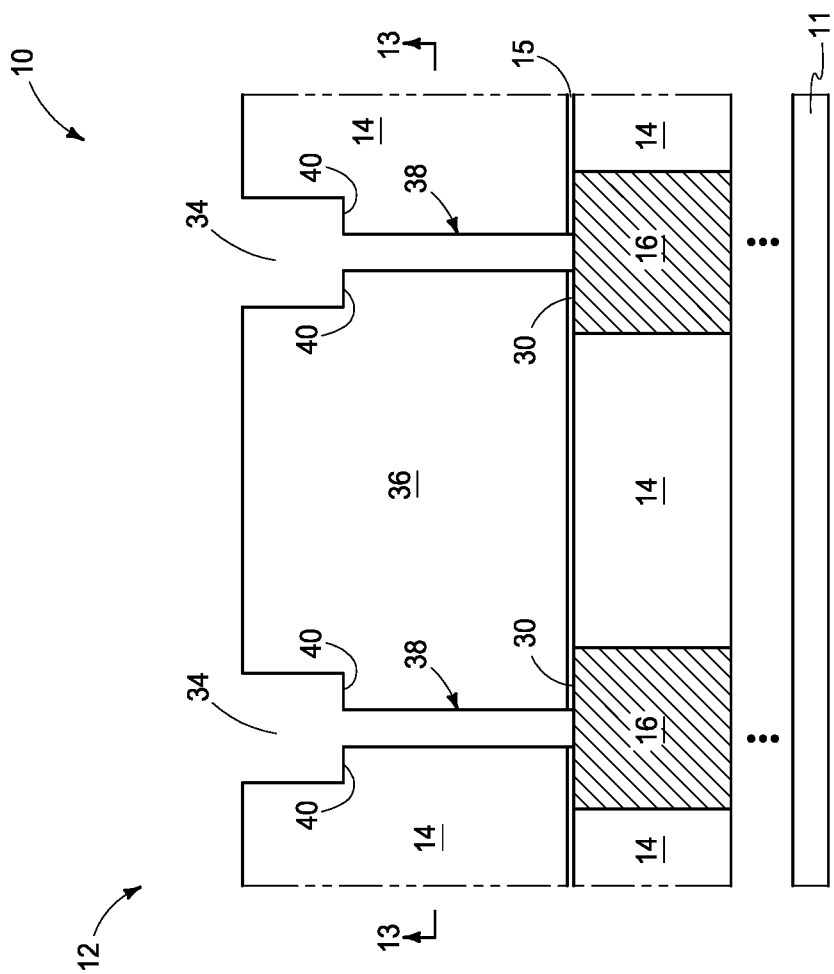
Figure 15:
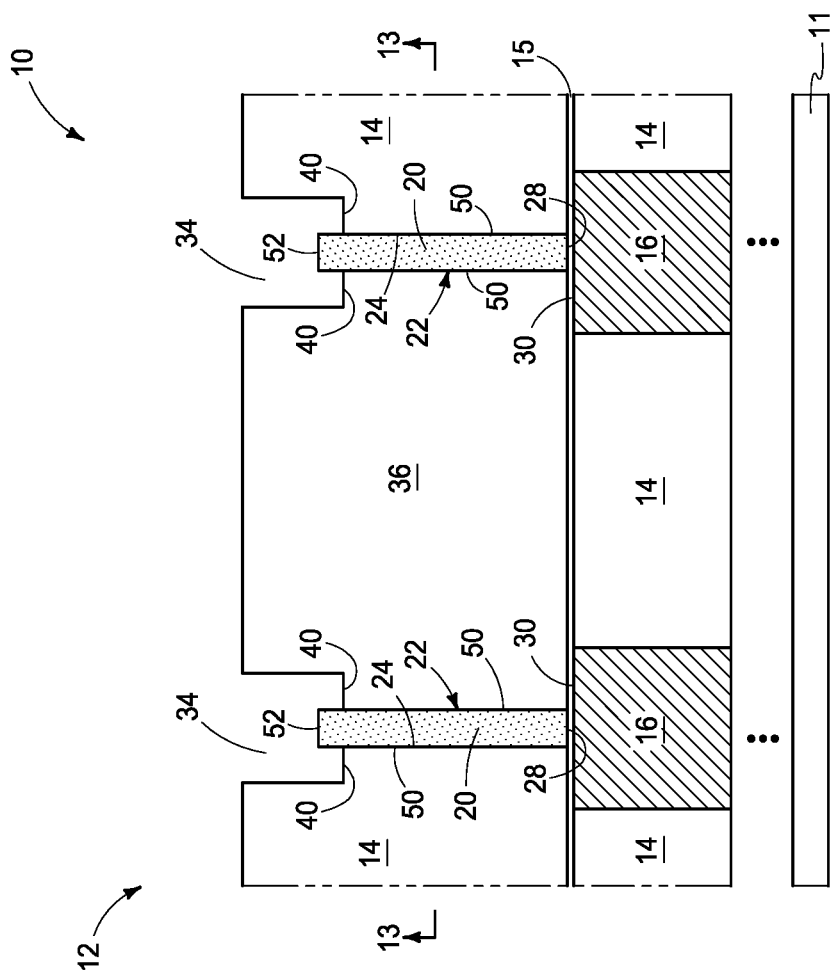

Referring to FIGS. 13-15, a contact opening 38 has been formed through individual walls 22 (e.g., by masked anisotropic etching of second insulative material 20). Contact opening 38 extends to the respective one of two laterally-spaced conductive nodes 16 directly above which the respective individual wall 22 was formed.

Referring to FIGS. 16-19, conductive material 42 has been formed in contact openings 38 and directly above vertically-recessed walls 22 (e.g., in troughs 34). Conductive material 42 comprises a conductive via 44 in contact opening 38 and a conductive line 46 directly above individual vertically-recessed walls 22. Conductive via 44 directly electrically couples together conductive line 46 with the respective one of two laterally-spaced conductive nodes 16 directly above which the respective individual wall 22 was formed. In one embodiment, the forming of conductive material 42 comprises forming a first conducting material 43 (e.g., titanium nitride) to line and less-than-fill horizontally-elongated trough 34 and the respective contact opening 38 directly therebelow. Then, a second conducting material 45 that is of different composition from that of first conducting material 43 (e.g., of higher conductivity than that of first conducting material 43; e.g., elemental tungsten) is formed to fill remaining volumes of horizontally-elongated trough 34 and the respective contact opening 38 directly therebelow. In one such embodiment, the forming of second conducting material 45 is conducted selectively onto first conducting material 43 relative to exposed surfaces of first insulative material 14 and insulating material 36. In another embodiment, the forming of second conducting material 45 is conducted non-selectively onto first conducting material 43 and onto exposed surfaces of first insulative material 14 and insulating material 36. Regardless, conductive material 42 may ultimately be planarized back at least to top surfaces of first insulative material 14 and insulating material 36 to form the example depicted construction.

Figure 16:
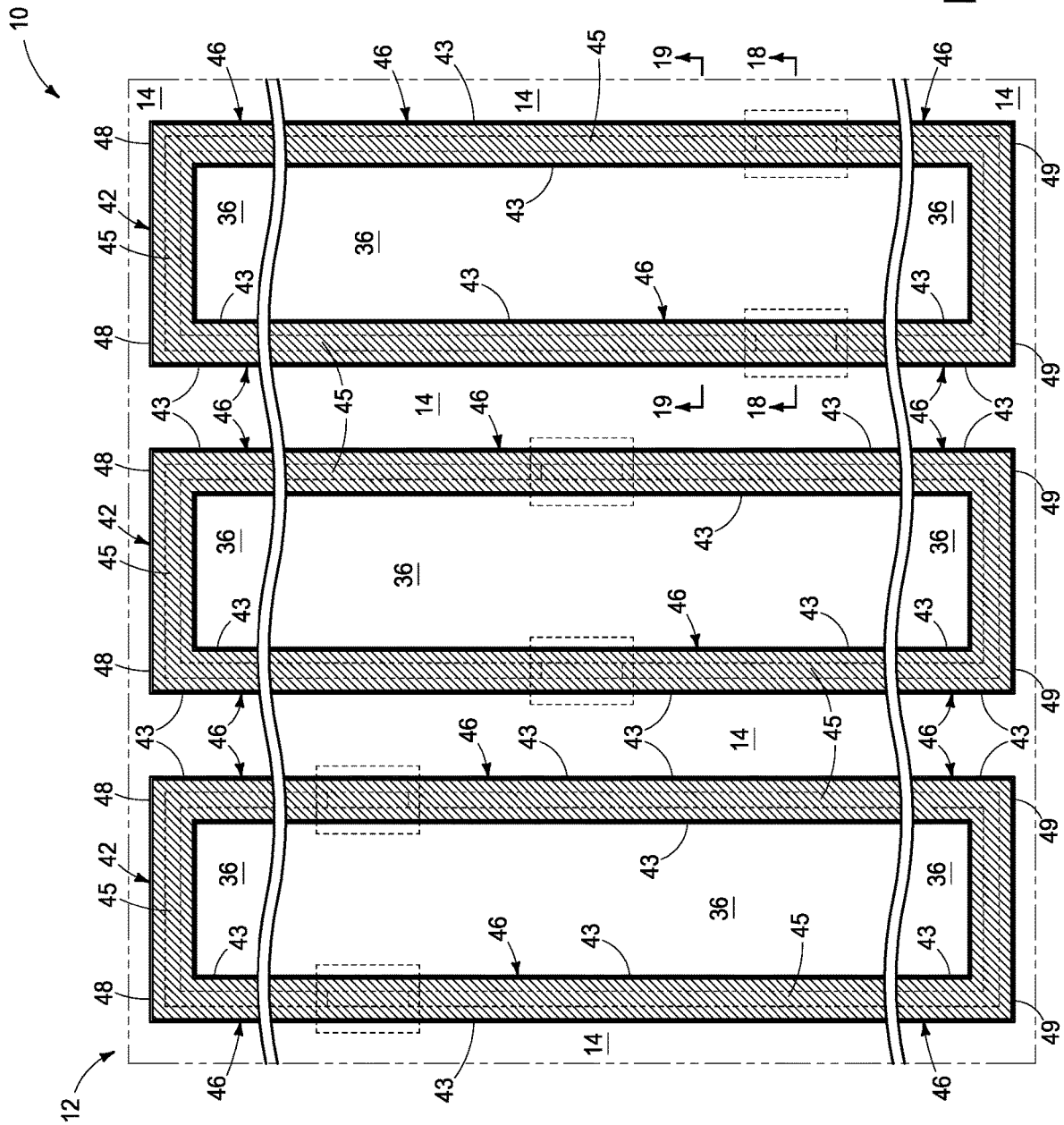
Figure 17:
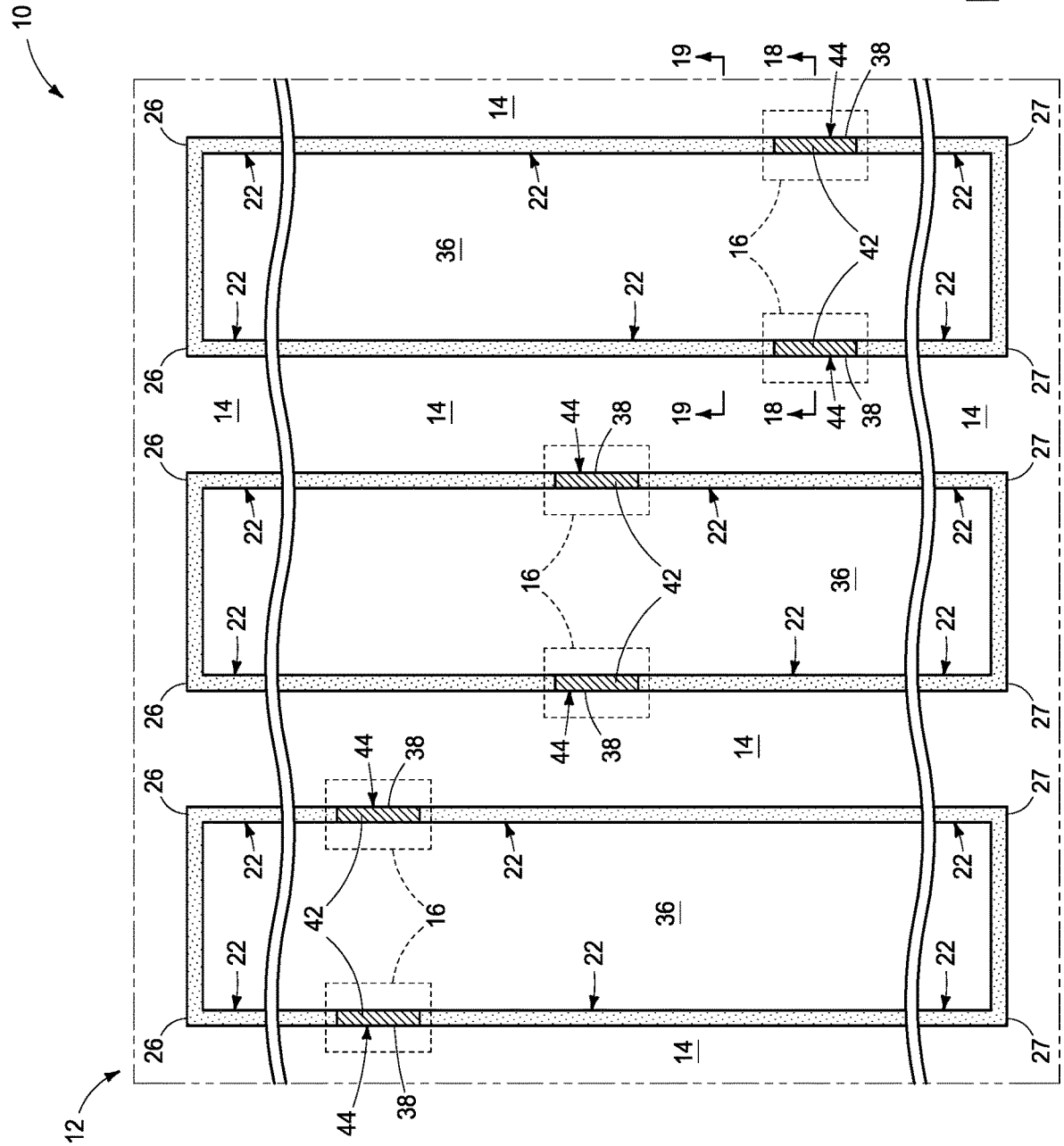
Figure 18:
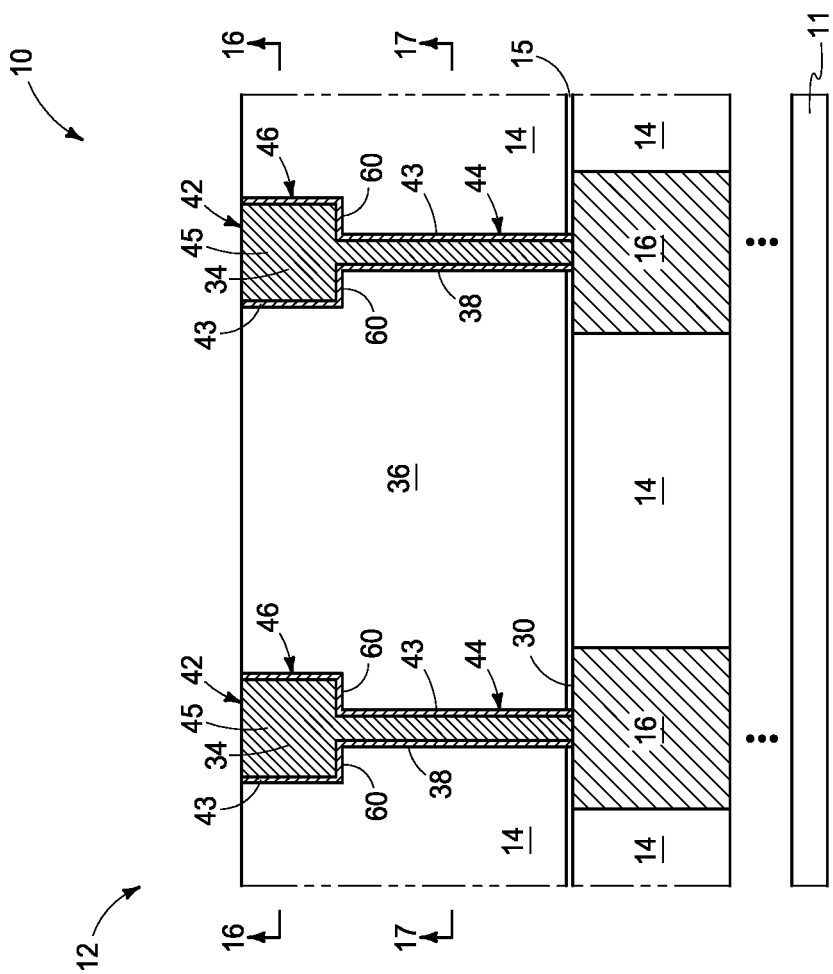
Figure 19:
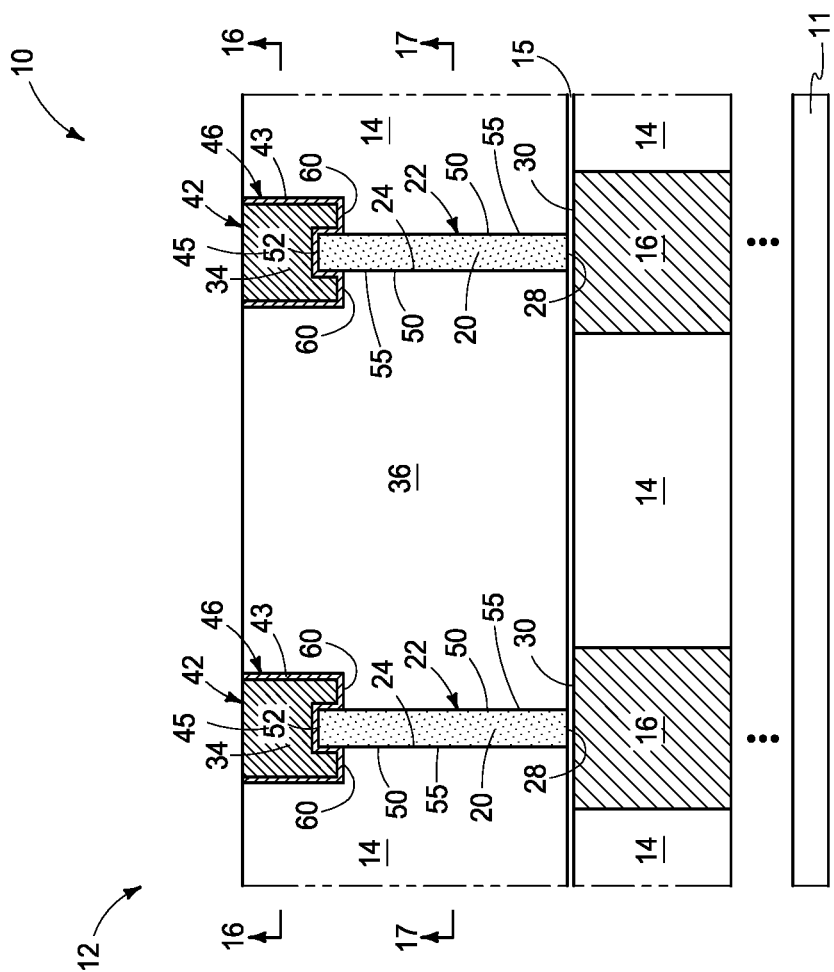
Figure 20:
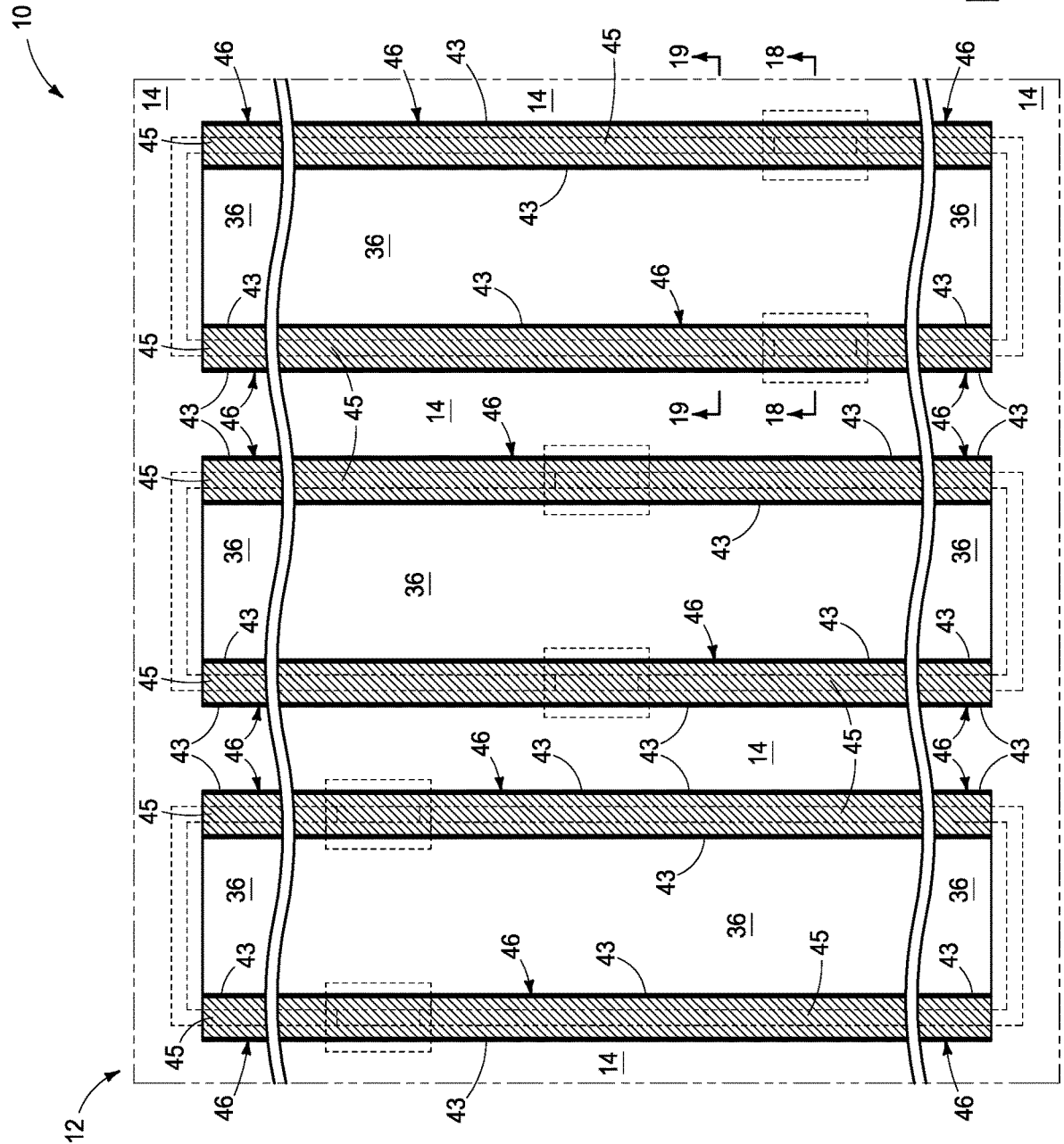
Figure 21:
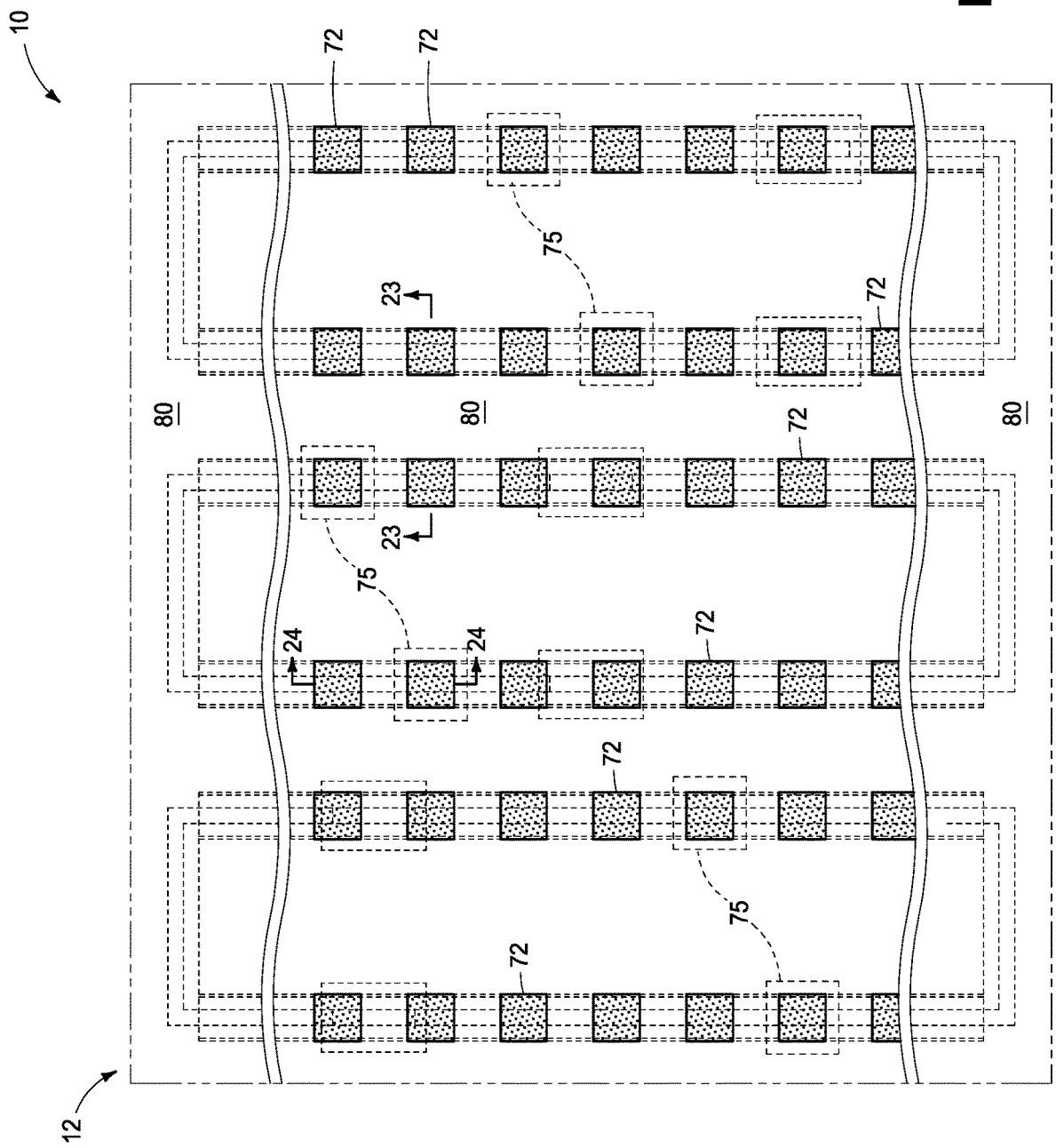
Figure 22:
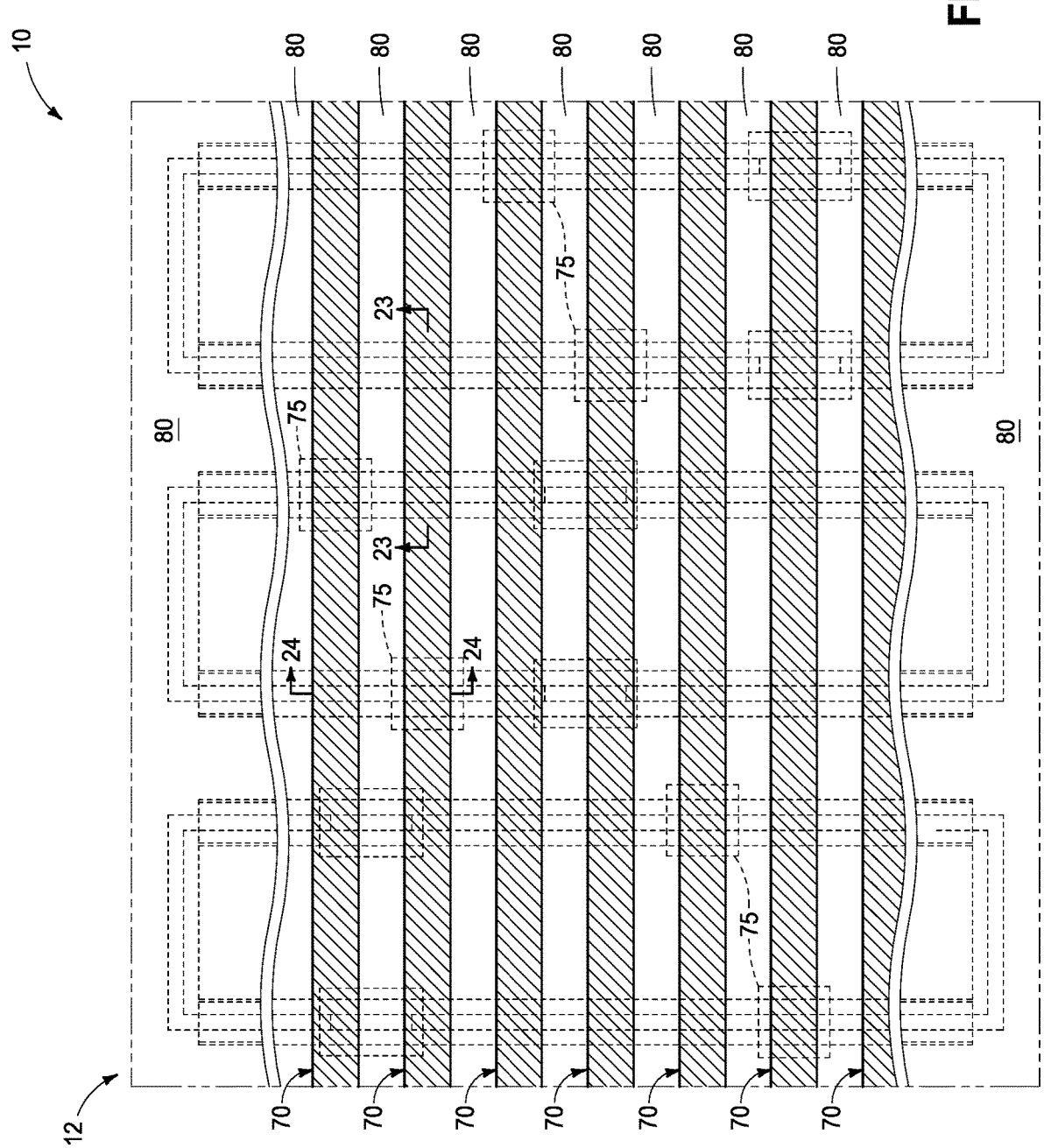
Figure 24:
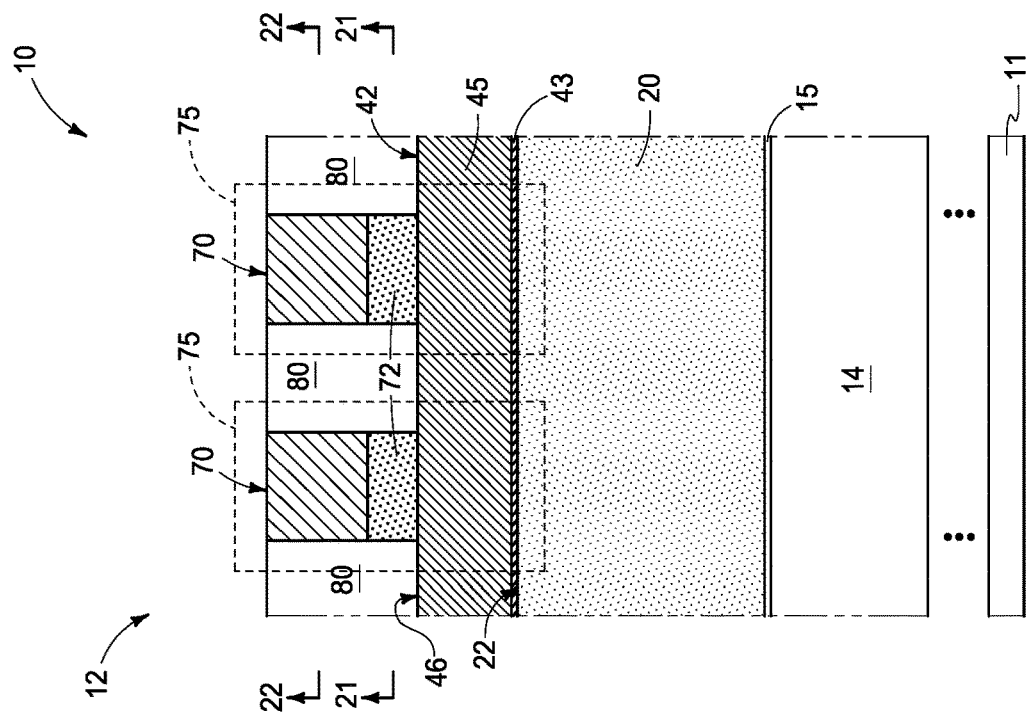
Figure 23:
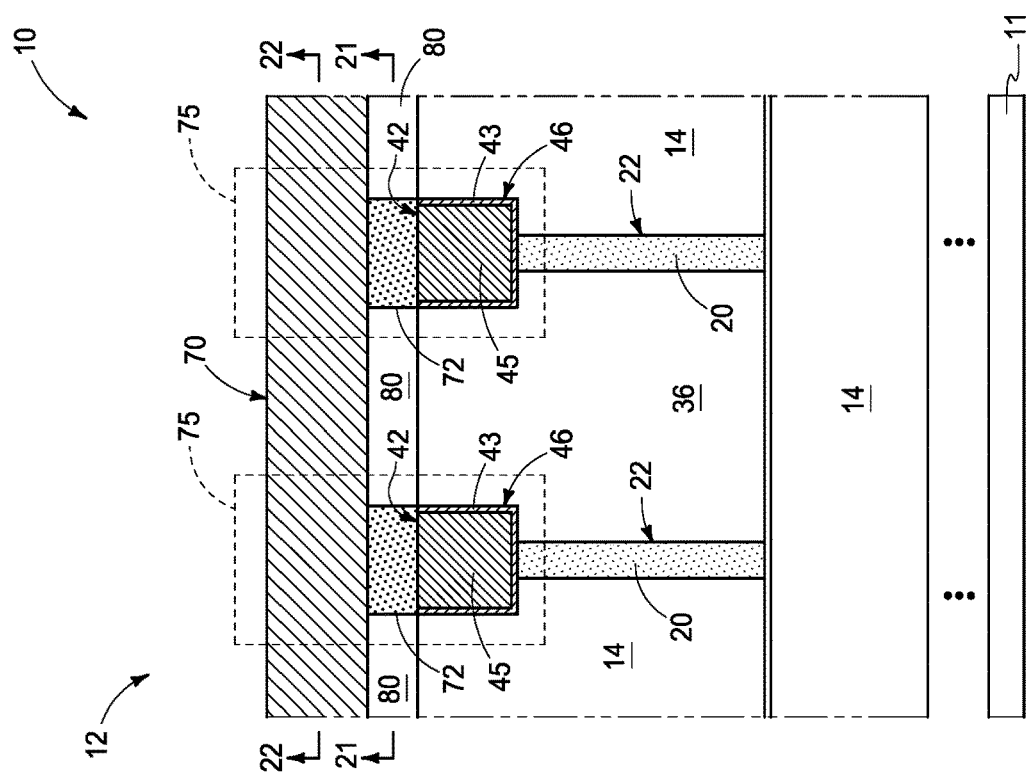

FIG. 16 shows, in one embodiment, conductive line 46 that is directly above one of two laterally-spaced conductive nodes 16 and conductive line 46 that is directly above the other of two laterally-spaced conductive nodes 16 are connected at their respective longitudinally-opposing longitudinal ends 48, 49. In one such embodiment, and referring to FIG. 20, the method includes severing (e.g., by masked anisotropic etching) of such conductive lines 46 at their respective longitudinally-opposing longitudinal ends 48, 49 so that said conductive lines 46 are not connected in a finished circuitry construction. In one embodiment, walls 22 are not so severed at their respective longitudinally-opposing longitudinal ends 26, 27 so that such walls 22 remain connected in the finished circuitry construction (e.g., FIG. 17). Regardless, longitudinal ends 26, 27, 48, and/or 49 may be within outside of array area 12.

Other conductive vias (e.g., larger and not shown) may be formed within or outside of array area 12 commensurately with forming of conductive vias 44.

In one embodiment, the integrated circuitry being fabricated comprises cross-point memory circuitry, for example as shown in FIGS. 21-24. Such shows example subsequent processing whereby construction 10 comprises an array 12 of cross-point memory cells (e.g., 75) that individually comprise part of a lower conducting line (e.g., the lower conducting line being one of lower conductive lines 46), part of an upper conducting line (e.g., 70) that crosses the lower conducting line, and programmable material (e.g., 72) that is vertically-between the lower conducting line and the upper conducting line where such cross. A select device (not shown) may be associated with or comprise part of the individual memory cells. Example insulative material 80 is shown surrounding components 70 and 72 (e.g., doped and/or undoped silicon dioxide, silicon nitride, or aluminum oxide).

Any other attribute(s) or aspect(s) as shown and/or described herein with respect to other embodiments may be used with respect to the above-described embodiments.

In one embodiment, a method used in forming integrated circuitry comprises forming two horizontally-elongated and laterally-spaced insulative-material walls (e.g., 22; e.g., regardless of forming a trench 18 and otherwise regardless of how such are formed). Individual of the walls are formed directly above a respective one of two laterally-spaced conductive nodes (e.g., 16). The walls are vertically recessed relative to uppermost surfaces of insulator material (e.g., materials 14 and 36) that is laterally-aside and laterally-between the individual walls. A contact opening (e.g., 38) is formed through the individual walls. The contact opening extends to the respective one of the two laterally-spaced conductive nodes directly above which the respective individual wall was formed. Conductive material (e.g., 42) is formed in the contact openings and directly above the vertically-recessed walls. The conductive material comprises a conductive via (e.g., 44) in the contact opening and a conductive line (e.g., 46) directly above individual of the vertically-recessed walls. The conductive via directly electrically couples together the conductive line with the respective one of the two laterally-spaced conductive nodes directly above which the respective individual wall was formed. In one embodiment, the insulative material and the insulator material are of the same composition relative one another and in another embodiment are not. Any other attribute(s) or aspect(s) as shown and/or described herein with respect to other embodiments may be used.

Pitch multiplication may be used in fabrication of any of the above components. Combining the forming of the conductive material of conductive lines and conductive vias directly thereunder as described herein may improve or eliminate overlay margin issues.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, integrated circuitry (e.g., comprising construction 10 in FIGS. 16-20 or construction 10 in FIGS. 21-24) comprises a horizontally-elongated insulative wall (e.g., 22) directly above a conductive node (e.g., 16). The wall comprises insulative material (e.g., 20). A conductive via (e.g., 44) extends through the wall to the conductive node. A conductive line (e.g., 46) is directly above the wall and directly above the conductive via. The conductive via directly electrically couples together the conductive line with the conductive node. Insulator material (e.g., materials 14 and 36) is longitudinally-along laterally-opposing sides (e.g., 50) of the wall. An interface (e.g., 55 in FIG. 19) of the insulative material of the wall and the insulator material is on each of the laterally-opposing sides of the wall. In one embodiment, the interface is continuous all horizontally-along the wall and in another embodiment the interface is discontinuous at least somewhere horizontally-along the wall. The interface will be so continuous when the insulator material and the insulative material are of different compositions relative one another. The interface may or may not be so continuous when the insulator material and the insulative material are of the same composition relative to one another. For example, separate-in-time formed insulator material and insulative material of the same composition relative one another may nevertheless have a perceptible interface in a finished construction. Some of that interface may effectively disappear (i.e., not be perceptible) and some may remain perceptible whereby that interface is discontinuous in one or more locations longitudinally-there-along (e.g., as may occur by welding of the same-composition materials together due to subsequent heating during manufacture).

In one embodiment, the conductive line has a bottom (e.g., 60) on each of the laterally-opposing sides of the wall that is below a top (e.g., 52) of the wall. In one embodiment, the conductive line is laterally wider than the wall and in one such embodiment the conductive line extends laterally-outward beyond both of the laterally-opposing sides of the wall longitudinally along the wall. In one embodiment, the conductive line has a bottom that is below a top of the wall and in one such embodiment the conductive line is directly against at least one of the laterally-opposing sides of the wall, and in one such latter embodiment the conductive line is directly against both of the laterally-opposing sides of the wall.

In one embodiment, the insulative material and the insulator material are of the same composition relative one another and in another embodiment are of different compositions relative one another.

Any other attribute(s) or aspect(s) as shown and/or described herein with respect to other embodiments may be used.

In one embodiment, an array (e.g., 12) of cross-point memory cells (e.g., 75) comprises laterally-spaced lower conducting lines (e.g., 46), laterally-spaced upper conducting lines (e.g., 70) that cross the laterally-spaced lower conducting lines, and programmable material (e.g., 72) of individual cross-point memory cells (e.g., 75) vertically-between the laterally-spaced lower conducting lines and the laterally-spaced upper conducting lines where such cross. A horizontally-elongated insulative wall (e.g., 22) is directly below individual of the lower conducting lines and is directly above a conductive node (e.g., 16). The wall comprises insulative material (e.g., 20). A conductive via (e.g., 44) extends through the wall to the conductive node and directly electrically couples one of the lower conducting lines to the conductive node. Insulator material (e.g., 14 and 36) is longitudinally-along laterally-opposing sides (e.g., 50) of the wall. An interface (e.g., 55) of the insulative material of the wall and the insulator material is on each of the laterally-opposing sides of the wall.

In one embodiment, the lower conducting lines are laterally wider than the walls, and in one such embodiment the lower conducting lines individually extend laterally-outward beyond both of the laterally-opposing sides of the respective wall therebelow longitudinally along the respective wall therebelow.

In one embodiment, the lower conducting lines individually have a bottom that is below a top of the respective wall therebelow, and in one such embodiment the lower conducting lines individually are directly against at least one of the laterally-opposing sides of the respective wall therebelow, and in one such latter embodiment, the conductive line is directly against both of the laterally-opposing sides of the wall.

In one embodiment, the lower conducting lines individually have a bottom on each of the laterally-opposing sides of the respective wall therebelow that is below a top of the respective wall therebelow. In one embodiment, the insulative material and the insulator material are of the same composition relative one another and in another embodiment they are not.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components).

Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/ conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming two horizontally-elongated and laterally-spaced insulative-material walls. Individual of the walls are formed directly above a respective one of two laterally-spaced conductive nodes. The walls are vertically recessed relative to uppermost surfaces of insulator material that is laterally-aside and laterally-between the individual walls. A contact opening is formed through the individual walls. The contact opening extends to the respective one of the two laterally-spaced conductive nodes directly above which the respective individual wall was formed. Conductive material is formed in the contact openings and directly above the vertically-recessed walls. The conductive material comprises a conductive via in the contact opening and a conductive line directly above individual of the vertically-recessed walls. The conductive via directly electrically couples together the conductive line with the respective one of the two laterally-spaced conductive nodes directly above which the respective individual wall was formed.

In some embodiments, a method used in forming integrated circuitry comprises forming first insulative material directly above two laterally-spaced conductive nodes. A horizontally-elongated trench is formed in the first insulative material. The horizontally-elongated trench is directly above and spans laterally-between the two laterally-spaced conductive nodes. Two horizontally-elongated laterally-spaced second insulative material walls are formed aside laterally-opposing sides of the horizontally-elongated trench. Individual of the walls are directly above a respective one of the two laterally-spaced conductive nodes. Space that is laterally-between the walls is filled with insulating material. The walls are vertically recessed relative to uppermost surfaces of the first insulative material and the insulating material. A contact opening is formed through the individual walls. The contact opening extends to the respective one of the two laterally-spaced conductive nodes directly above which the respective individual wall was formed. Conductive material is formed in the contact openings and directly above the vertically-recessed walls. The conductive material comprises a conductive via in the contact opening and a conductive line directly above individual of the vertically-recessed walls. The conductive via directly electrically couples together the conductive line with the respective one of the two laterally-spaced conductive nodes directly above which the respective individual wall was formed.

In some embodiments, integrated circuitry comprises a horizontally-elongated insulative wall directly above a conductive node. The wall comprises insulative material. A conductive via extends through the wall to the conductive node. A conductive line is directly above the wall and directly above the conductive via. The conductive via directly electrically couples together the conductive line with the conductive node. Insulator material is longitudinally-along laterally-opposing sides of the wall. An interface of the insulative material of the wall and the insulator material are on each of the laterally-opposing sides of the wall.

In some embodiments, an array of cross-point memory cells comprises laterally-spaced lower conducting lines, laterally-spaced upper conducting lines that cross the laterally-spaced lower conducting lines, and programmable material of individual cross-point memory cells vertically-between the laterally-spaced lower conducting lines and the laterally-spaced upper conducting lines where such cross. A horizontally-elongated insulative wall is directly below individual of the lower conducting lines and that is directly above a conductive node. The wall comprises insulative material. A conductive via extends through the wall to the conductive node and that directly electrically couples one of the lower conducting lines to the conductive node. Insulator material is longitudinally-along laterally-opposing sides of the wall. An interface of the insulative material of the wall and the insulator material is on each of the laterally-opposing sides of the wall.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
    forming two horizontally-elongated and insulative-material walls comprising a first wall and a second wall spaced laterally from the first wall, the first wall being formed directly above a first conductive node and the second wall being formed directly above a second conductive node;
    vertically recessing the first wall and the second wall relative to uppermost surfaces of insulator material that is laterally-aside and laterally-between the first wall and the second wall;
    forming a first contact opening through the first wall and a second contact opening through the second wall, the first contact opening extending to the first conductive node and the second contact opening extending to the second conductive node; and
    forming conductive material in the first contact opening and the second contact opening, the conductive material comprising a first conductive via in the first contact opening, a second conductive via in the first contact opening and being configured as a conductive line, the first conductive via directly electrically coupling together the conductive line with the first conductive node and the second conductive via directly electrically coupling the conductive line with the second conductive node.

2. The method of claim 1 wherein the vertically recessing of the first wall and the second wall forms a first horizontally-elongated trough in the insulator material directly above the first wall and a second horizontally-elongated trough in the insulator material directly above the second wall, and further comprising etching the insulator material to laterally-widen the first horizontally-elongated tough and the second horizontally-elongated trough.

3. The method of claim 2 wherein the etching forms a bottom in each of the first horizontally-elongated trough and the second horizontally-elongated through in the insulator material to be lower than tops of the first wall and the second wall.

4. The method of claim 1 comprising forming the first wall to have a bottom that is vertically-spaced directly above a top of the first conductive node.

5. The method of claim 1 wherein the insulative material and the insulator material are of the same composition relative one another.

6. The method of claim 1 wherein the insulative material and the insulator material are of different compositions relative one another.

7. The method of claim 1 wherein,
the vertically recessing forms a first horizontally-elongated trough in the insulator material directly above the first wall; and
the forming the conductive material comprises:
forming a first conducting material to line and less-than-fill the first horizontally-elongated trough and the first contact; and
forming a second conducting material that is of different composition from that of the first conducting material to fill remaining volume of the first horizontally-elongated trough and the first contact opening.

8. The method of claim 7 wherein the forming of the second conducting material is conducted selectively onto the first conducting material relative to exposed surfaces of the insulator material.

9. The method of claim 7 wherein the forming of the second conducting material is conducted non-selectively onto the first conducting material and onto exposed surfaces of the insulator material.

10. The method of claim 1 wherein the integrated circuitry comprises cross-point memory circuitry comprising an array of cross-point memory cells that individually comprise part of a lower conducting line, part of an upper conducting line that crosses the lower conducting line at a cross-point, and programmable material vertically-between the lower conducting line and the upper conducting line at the cross-point.

11. A method used in forming integrated circuitry, comprising:
forming first insulative material directly above two laterally-spaced conductive nodes, the laterally-spaced conductive nodes comprising a first conductive node and a second conductive node;
forming a horizontally-elongated trench in the first insulative material, the horizontally-elongated trench being directly above and spanning laterally-between the first conductive node and the second conductive node;
forming two horizontally-elongated laterally-spaced second insulative material walls comprising a first wall and a second wall, the first wall and the second wall being on laterally-opposing sides of the horizontally-elongated trench, the first wall being directly above the first conductive node and the second wall being directly above the second conductive node;
filling a space laterally-between the first wall and the second wall with an insulating material;
vertically recessing the first wall and the second wall relative to uppermost surfaces of the first insulative material and the insulating material;
forming a first contact opening through the first wall and a second contact opening through the second wall, the first contact opening extending to the first conductive node and the second contact opening extending to the second conductive node; and
forming a conductive material in the first contact opening and the second contact opening, the conductive material comprising a first conductive via in the first contact opening, a second conductive via in the second contact opening and a first conductive line directly above the first wall and a second conductive line directly above the second wall, the first conductive via directly electrically coupling the first conductive line with the first conductive node and directly electrically coupling the second conductive line with the second conductive node.

12. The method of claim 11 wherein the first and second insulative materials are of the same composition relative one another.

13. The method of claim 11 wherein the first and second insulative materials are of different compositions relative one another.

14. The method of claim 11 wherein:
the first wall and the second wall are connected at longitudinally-opposing longitudinal ends; and
the first conductive line and the second conductive line are connected at longitudinally-opposing longitudinal ends.

15. The method of claim 14 further comprising severing said first conductive line from the second conductive line.

16. The method of claim 15 wherein the first wall and the second wall remain connected in a finished circuitry construction.

17. The method of claim 11 wherein the integrated circuitry comprises cross-point memory circuitry comprising an array of cross-point memory cells that individually comprise part of a lower conducting line, part of an upper conducting line, the upper conducting line crossing the lower conducting line at a cross-point, and comprise programmable material vertically-between the lower conducting line and the upper conducting line at the cross-point, the conductive line being the lower conducting line.

* * * * *